United States Patent [19]

Jeong

[11] Patent Number: 4,988,897
[45] Date of Patent: Jan. 29, 1991

[54] TTL TO CMOS INPUT BUFFER CIRCUIT

[75] Inventor: Tae-sung Jeong, Seoul, Rep. of Korea

[73] Assignee: Samsung Electronics, Co., Ltd., Suwon, Rep. of Korea

[21] Appl. No.: 396,477

[22] Filed: Aug. 21, 1989

[30] Foreign Application Priority Data

May 27, 1989 [KR] Rep. of Korea .............. 89-7106[U]

[51] Int. Cl.⁵ .............. H03K 19/092; H03K 19/094; H03K 19/017; H03K 17/284
[52] U.S. Cl. .............................. 307/475; 307/451/279
[58] Field of Search .............. 307/475, 264, 270, 571, 307/594, 451, 585, 576, 579, 279, 443

[56] References Cited

U.S. PATENT DOCUMENTS

| | | | |
|---|---|---|---|
| 4,437,024 | 3/1984 | Wacyk ............................ | 307/475 |
| 4,628,218 | 12/1986 | Nakaizumi ...................... | 307/451 |
| 4,698,526 | 10/1987 | Allan ............................... | 307/475 |
| 4,916,337 | 4/1990 | Leung et al. .................... | 307/475 |
| 4,929,853 | 5/1990 | Kim et al. ...................... | 307/475 |

*Primary Examiner*—Stanley D. Miller
*Assistant Examiner*—David R. Bertelson
*Attorney, Agent, or Firm*—Cushman, Darby & Cushman

[57] ABSTRACT

A TTL to CMOS buffer includes a PMOS transistor and an NMOS transistor connected in series between Vcc and Vss. The buffer input is applied to the gate of both the PMOS and the NMOS transistor, and the buffer output is provided from the point of connection between the PMOS and the NMOS transistor. At least one other PMOS transistor has one current electrode connected to Vcc and a current electrode connected by a switch to the point of connection between the first PMOS and the NMOS transistor. At least one NMOS transistor has one current electrode connected to VSS and a current electrode connected by another switch to the point of connection between the first PMOS and the first NMOS transistor. Each switch is controlled by respective control signal generated by a temperature detecting circuit; each control signal is indicative of whether the device temperature is above or below a different predetermined level. There is a plurality of pairs of a MOS transistor set to be operated in the sub-threshold region as a current supply, and a polycrystal-line source of resistance serially connected to the MOS transistor between Vcc and Vss. The voltage from the point of connection between the MOS transistor and the resistor in each such pair is passed through a digital converter to provide a switching signal which controls a corresponding switch.

43 Claims, 4 Drawing Sheets

TTL TO CMOS INPUT BUFFER CIRCUIT

FIELD OF THE INVENTION

The present invention relates to a CMOS input buffer circuit, and in particular, to an input buffer circuit which is used for CMOS-type ultra high density semiconductor devices and which has a logic threshold voltage with temperature compensation.

BACKGROUND OF THE INVENTION

Because of a trend to make higher-integrity, higher precision, and higher-performance semiconductor devices, device power consumption is increased. Hence, more careful consideration to the operating characteristics resulting from temperature change is required.

Generally, CMOS input buffer circuits include CMOS inverters. A TTL voltage level applied as input to a CMOS inverter would be converted to a corresponding signal having a CMOS voltage level at the inverter output. However, the logic threshold voltage of a CMOS inverter varies with changes in temperature. At a low temperature, high level input characteristics worsen because the logic threshold voltage level is raised. At a high temperature, low level input characteristics worsen because the logic threshold voltage level is lowered.

Variations in the input characteristics which result from surrounding temperature changes cause many problems, such as instability in circuit operation and reduction in circuit speed.

The logic threshold voltage of a CMOS inverter is a function of the ratio between the gain constants of its p-channel and of its n-channel MOS transistor and of the threshold voltage of the device.

As the temperature is increased, the device gain constant $\beta$ is decreased to $\beta \propto 1/\sqrt{T^3}$ ("oc" meaning proportional to), because the mobility of the channel carrier is decreased by the increase in temperature. However, because the mobility of both holes and of electrons are affected by temperature to a similar extent, the ratio between the gain constants ($\beta$ ratio $= \beta n / \beta p$) is independent of temperature.

On the other hand, the threshold voltages Vtn and Vtp of the device would both decrease by the temperature coefficient of 2mV/°K, responsive to an increase in temperature. For example, if the temperature is increased by 50° C., the logic threshold voltage is decreased by 0.4 V. Thus, the low-level input characteristics of a CMOS input buffer circuit worsen at a higher temperature range, and the high-level input characteristics worsen at a lower temperature range.

SUMMARY OF THE INVENTION

It is an object of this invention to provide a CMOS input buffer circuit having temperature-compensated logic threshold voltage characteristics, by varying the ratio of the MOS transistor gain constant in response to temperature change.

It is another object of this invention to provide a CMOS input buffer circuit that minimizes the change in input characteristics of very large scale integrated semiconductor devices with temperature change.

A buffer is provided having a first MOS transistor of one conduction type and a second MOS transistor of another conduction type, which are serially connected to each other between a first power source and a second power source. A buffer input signal is applied to the gate of both MOS transistors, and the buffer output is provided from the point of connection between them. A third MOS transistor of the same conduction type as the first MOS transistor has one current electrode connected to the first power source and another current electrode connected by a switch to the point of connection between the first and the second MOS transistors. The switch is controlled by a signal indicative of whether the device temperature is above or below a predetermined temperature level. That combination causes the gain constant of the buffer to become temperature sensitive, thus providing for temperature compensation.

BRIEF DESCRIPTION OF THE DRAWINGS

The invention, together with its object and the advantages thereof, may best be understood by reference to the detailed description taken in conjunction with the accompanying drawings in which.

DETAILED DESCRIPTION OF THE PRESENT INVENTION

Figure 1:
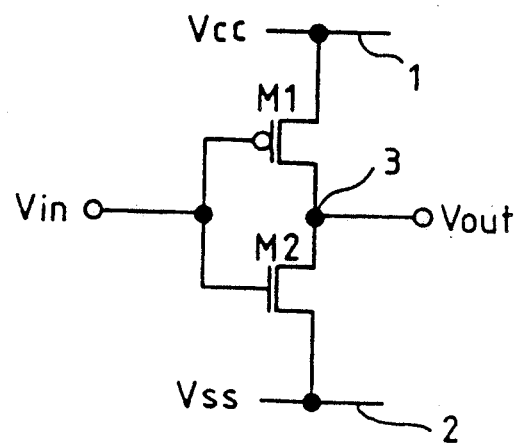
FIG. 1 illustrates a conventional CMOS input buffer circuit.
Figure 2:
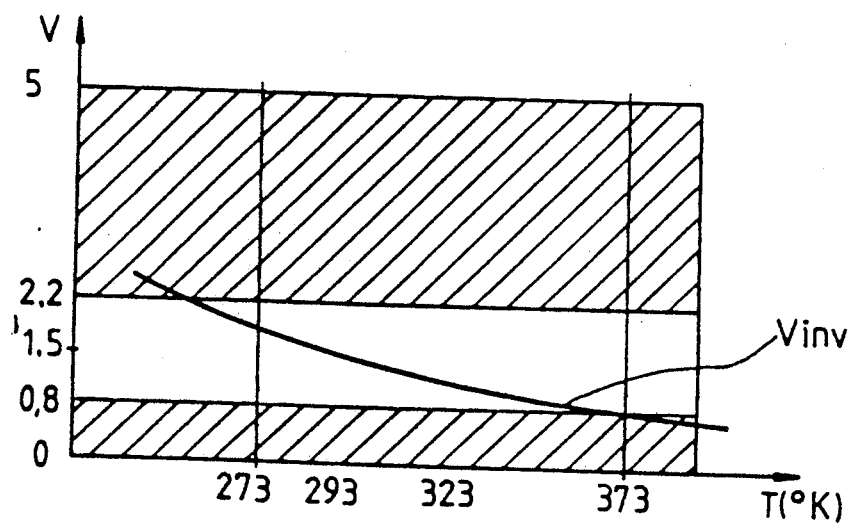
FIG. 2 is a graph showing the relationship between logic threshold voltage characteristics and temperature variation for a conventional CMOS input buffer.

In FIG. 1, a circuit according to the prior art is shown. A first P-channel MOS transistor M1 and a second N-channel MOS transistor M2 are serially connected through their current electrodes between a first power supply line 1 supplying source Vcc, and a second power supply line 2 supplying source Vss. M1 is connected to power line 1 and M2 to power line 2. Input signal of TTL voltage level is applied in common to the gate electrode of both M1 and M2, and the output CMOS voltage level is taken from the point of connection between M1 and M2 (here, between their drains). In that circuit, the logic threshold voltage V inv is $$V_{inv} (V_{in} = V_{out}) = \frac{V_{DD} + V_{tp} + V_{tn}\sqrt{\left(\frac{\beta n}{\beta p}\right)}}{1 + \sqrt{\left(\frac{\beta n}{\beta p}\right)}}$$

where
VDD = Vcc + Vss : supply voltage,
Vtp = threshold voltage for p-channel MOS element,
Vtn = threshold voltage for n-channel MOS element, $\beta p$ = gain constant for n-channel MOS element,
$\beta n$ = gain constant for n-channel MOS element.

The above-mentioned gain constant ratio, $\beta r = \beta n/\beta p$, is independent of temperature, but is dependent on the size of the element. Thus, the logic threshold voltage value according to temperature change is dependent on the threshold voltages of the elements, Vtp and Vtn. It is lowered if the temperature is raised, and it is raised if the temperature is lowered. Therefore, low input characteristics suffer at high temperatures and high input characteristics suffer low temperatures.

Figure 3:
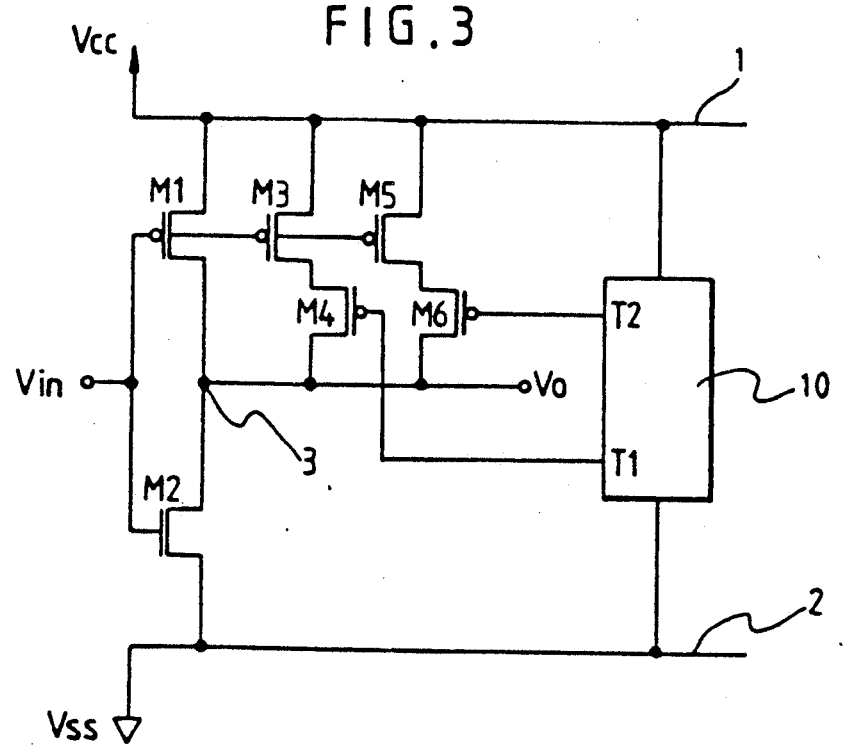
FIG. 3 illustrates an embodiment of the CMOS input buffer circuit in accordance with the present invention.

FIG. 3 is a circuit diagram of a preferred embodiment of this invention. As compared to the circuit of FIG. 1, FIG. 3 additionally includes (1) serially connected third and fourth MOS transistors M3 and M4 (both p-channel); (2) serially connected fifth and sixth MOS transistors M5 and M6 (both p-channel), between the Vcc supply line 1 and the common point of connection 3 between M1 and M2; and (3) a temperature detecting circuit 10.

The temperature detecting circuit 10 has two input terminals one of which is connected to the Vcc supply line 1 and the other to the Vss supply line 2; it also has two output terminals T1 and T2. The gates of M3 and M5 are both connected to TTL input Vin; the gate of M4 is connected to output terminal T1 of the temperature detecting circuit 10; and the gate of M6 is connected to output terminal T2 of the temperature detecting circuit 10.

In the embodiment shown in FIG. 3, temperature compensation of the logic threshold voltage is achieved by varying the overall gain constant $\beta p$ of the p-channel device, because M4 and M6 are switched according to the combination of output conditions on output terminals T1 and T2 of the temperature detection circuit 10. M4 is turned on if the signal at T1 indicates that the device temperature is increased to above a first predetermined temperature level; M6 is turned on when the signal at T2 indicates that the device temperature is increased to above a second predetermined temperature level.

In this embodiment, M4 and M6 are switches which are controlled by respective outputs from the temperature detecting circuit 10. When the temperature increases to above respective predetermined levels, switches M4 and/or M6 are turned on. That causes the overall gain constants of the p-channel MOS transistors M1, M3, and M5 to increase and the gain ratio $\beta r$ ($\beta n/\beta p$) to decrease. Consequently, at high temperature, the logic threshold voltage level is increased. Effective temperature compensation is thus achieved.

Thus, between power line 1 and the point of connection 3 is connected two pairs of a combination including a P channel MOS transistor M3/M5 and a switch M4/M6 (shown as a P channel MOS transistor). Each switch is connected between the point of connection 3 and the drain of the corresponding P channel MOS transistor of which the source is connected to power line 1 and of which the gate is connected to TTL input Vin. Each switch is controlled by a separate signal from temperature detecting circuit 10.

Figure 4:
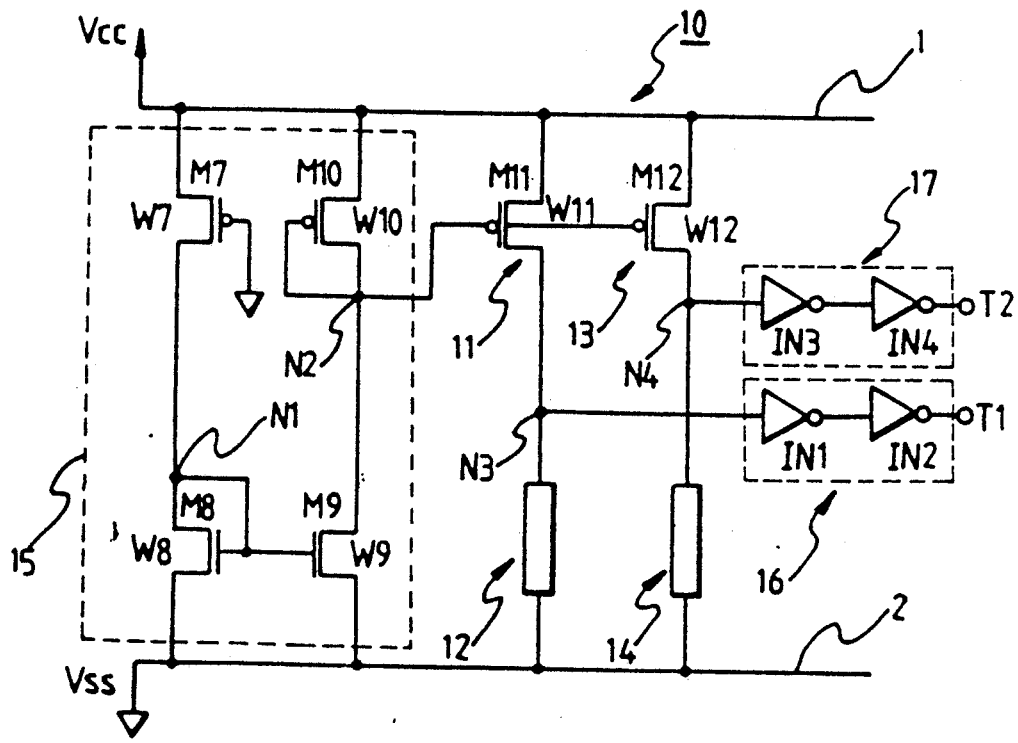
FIG. 4 illustrates a temperature detecting circuit example of the CMOS input buffer circuit shown in FIG. 3.

FIG. 4 is a circuit diagram of one embodiment of the temperature detection circuit 10. P-channel MOS transistors M11 and M12 are operated in the subthreshold region as respective current supplies. The source of M11 is connected to the first power supply line 1; the drain of M1 is connected to a node N3; and the gate of M11 is connected to a current setting circuit 15. A polycrystalline silicon source of resistance 12 has one terminal connected to node N3, and another terminal connected to the second power supply line 2. The source of M12 is connected to the first power supply line 1; the drain of M12 is connected to a node N4; and the gate of M12 is connected to the current set-up circuit 15. A polycrystalline silicon source of resistance 14 has one terminal connected to node N4, and another terminal connected to the second power supply line 2.

Each pair of current supply transistor and corresponding polycrystalline silicon source of resistance (polycrystalline silicon resistor) operates as a temperature sensor. Separate temperature sensors respectively output a different electrical output signal for the same surrounding temperature. The electrical output signal is taken from the point of connection in each temperature sensor between the current supply transistor and the corresponding polycrystalline silicon resistor.

Polycrystalline silicon, when it is either not doped or lightly doped with an impurity, has a resistance which not only is very large but also varies exponentially relative to changes in temperature. Also, for MOS transistors, when the gate voltage is lowered to below the threshold voltage, the drain current in the subthreshold region of a MOS transistor decreases exponentially. Making use of those characteristics, the temperature detecting circuit consumes very little power and is especially suited for very large scale semiconductor devices.

The current setting circuit 15 sets the drain current in the subthreshold region of M11 and M12. It includes four MOS transistors M7, M8, M9 and M10. A p-channel MOS transistor M7 has its source connected to the first power supply line 1, its gate to the second power supply line 2, and its drain to a node N1; its drain current Id1 flows toward node N1. An n-channel MOS transistor M8 has both its drain gate connected to node N1, and its source connected to the second power supply line 2. In order to operate the second MOS transistor M8 in the subthreshold region, the ratio between the geometric sizes of the M7 and M8 is made so that M7 is sufficiently larger: W7 < W8 (L7 = L8).

Another n-channel MOS transistor M9 has its gate connected to the node N1, its source connected to the second power supply line 2, and its drain connected to a node N2. Thus, M9 has the same gate bias voltage as that of M8. Accordingly, M9 will be operated in the subthreshold region regardless of its channel width. The M9 transistor is geometrically smaller than the M8 transistor. The drain circuit ID3 of M9 is $$ID3 = ID1 \frac{W9}{W8} \text{ (for } W9 < < W8, L9 = L8)$$

(M9 being sufficiently smaller than M8)

ID1 is the drain current of M7.

Another p-channel MOS transistor M10 has both its gate and its drain connected to node N2, and its source connected to the first power supply line 1. In order to operate M10 in the subthreshold region, the ratio between the geometric sizes of M9 and M10 is made so that W9 < W10(L9 = L10)(M10 being sufficiently larger than M9).

The gates of M11 and M12 are both connected to node N2. Therefore, M11 and M12 will have the same gate voltage as that of M10 and will be operated in the subthreshold region. Here, the ratio of the geometric sizes between M10 and M11 is made so that W10>W11(L10=L11). Hence the drain current ID5 of M11 will become $$ID5 = ID1 \frac{W9}{W8} \frac{W11}{W10}$$

where
ID1: the drain current of M7
W8–W11: the channel width of each MOS transistor
Moreover, the ratio between the geometric sizes of M10 and M12 is made so that W10>W12 (L10=L12).
Hence the drain current ID6 of M12 will be $$ID6 = ID1 \frac{W9}{W8} \frac{W12}{W10}$$

The setting of the drain current of the current supply transistors M11 and M12 is defined only by the drain current value of M7 in the current setting circuit 15 and by the ratios noted above in the geometrical sizes of the MOS transistors. Hence, the currents of the current supply transistors are independent of the process and temperature change. The current through each current supply transistor is different because the current supply transistors have different geometrical sizes. Accordingly, different electrical output signals for the same surrounding temperature can be obtained with polycrystalline silicon sources of resistance which have the same resistance.

Alternatively, different electrical output signals for the same surrounding temperature can be obtained by making the resistance of the polycrystalline silicon sources of resistance different while making the current supply currents the same.

In reference to FIG. 4, M7, M8, M9, M10, M11, and M12 are respectively designated as first, second, third, fourth, fifth, and sixth transistors of the temperature detecting circuit 10. Accordingly, the drain current of M7 is referred to as ID1; the drain current of M9 is referred to as ID3; the drain current of M11 is referred to as ID5; and the drain current of M12 is referred to as ID6.

Node 3 is a point of connection between M11 and the polycrystalline silicon source of resistance 12; node 4 is a point of connection between M12 and the polycrystalline silicon resistor 14. Node 3 is connected to the input of a digital conversion circuit 16 of which the output is provided to output terminal T1 of the temperature detecting circuit 10. Node 4 is connected to the input of a digital connection circuit 17 of which the output is provided to output terminal T2 of the temperature detecting circuit 10. The digital conversion circuits convert electrical output signals to digital signals.

Digital conversion circuit 16 as shown is a two-stage combination of cascaded inverters IN1 and IN2; digital conversion circuit 17 as shown is a two-stage combination of cascaded inverters IN3 and IN4.

The drain currents of M11 and M12 are related by this inequality:

ID5<ID6 (W11<W12)

If the polycrystalline silicon resistors 12 and 14 have the same resistance, the node voltages VN3, VN4 at nodes N3 and N4 will be defined as:

VN3 (T)=ID5 X RT1 (T)

VN4 (T)=IDb 6 X RT2 (T)

where RT1 is the resistance of the polycrystalline silicon of resistor 12 at T° K and RT2 is the resistance of the polycrystalline silicon resistor 14 at T° K. Because ID5<ID6 at the same temperature (T° K), VN3(T)<VN4 (T).

For example, if VN3 is set to reach the trip voltage of IN1 at 293° K (200° C.), and if VN4 is set to reach the trip voltage of IN3 at 323° K (50° C.), the output conditions at T1 and T2 are as shown in Table 1:

TABLE 1

| Output Terminal | Temperature (° K) | | |
|---|---|---|---|
| | 263~293 | 293~323 | 323~355 |
| T1 | HIGH | LOW | LOW |
| T2 | HIGH | HIGH | LOW |

The change in the ratio between gain constants, $\beta$ r, vs, temperature change in the circuit of FIG. 3 is shown in Table 2:

TABLE 2

| Temperature (°K.) | 263~293 | 293~323 | 323~355 |
|---|---|---|---|
| M4 | OFF | ON | ON |
| M6 | OFF | OFF | ON |
| $\beta$ p | $\beta$ 1 | $\beta$ 1 + $\beta$ 3 | $\beta$ 1 + $\beta$ 3 + $\beta$ 5 |
| $\beta r = \frac{\beta n}{\beta p}$ | Large | Medium | Small |

The $\beta$ constants of M1, M3, and M5 of FIG. 3 are respectively designated as $\beta$1, $\beta$3, and $\beta$5.

Figure 5:
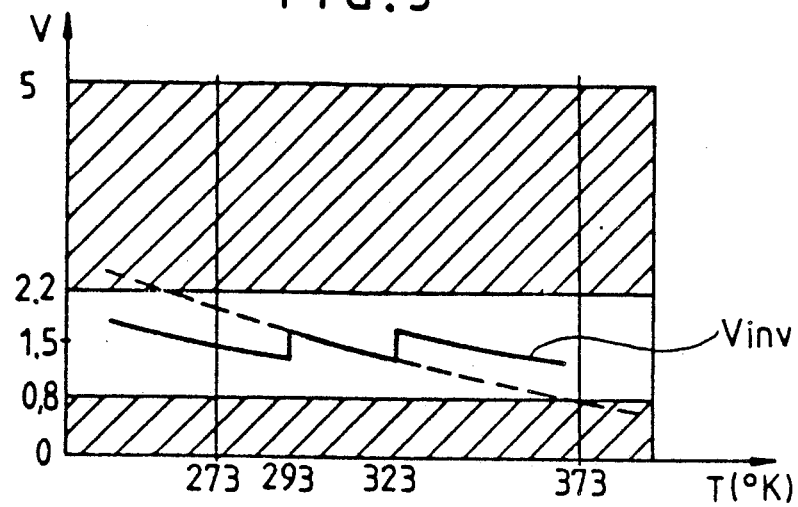
FIG. 5 is a graphical illustration of changes in the logic threshold voltage of the CMOS input buffer circuit shown in FIG. 3, responsive to temperature change.

As indicated in the dotted line in FIG. 5, the logic threshold value is lowered as the temperature is raised, but the ratio between the gain constants of the transistors becomes $$\beta r \text{ (above 323° K.)} = \frac{\beta n}{\beta 1 + \beta 3 + \beta 5}$$

and is decreased. Hence the logic threshold voltage is compensated as indicated in the solid line in FIG. 5. The deterioration in low-input level characteristics caused by temperature rise is prevented.

In the same manner, if the temperature is lowered, the logic threshold value is increased as indicated in dotted line in FIG. 5, but the ratio between the gain constants of the transistors is increased to $$\beta r \text{ (below 293° K.)} = \frac{\beta n}{\beta 1}$$

The logic threshold voltage will be compensated as indicated in the solid line in FIG. 5. Deterioration in high input level characteristics caused by a temperature decrease would be prevented.

Figure 6:
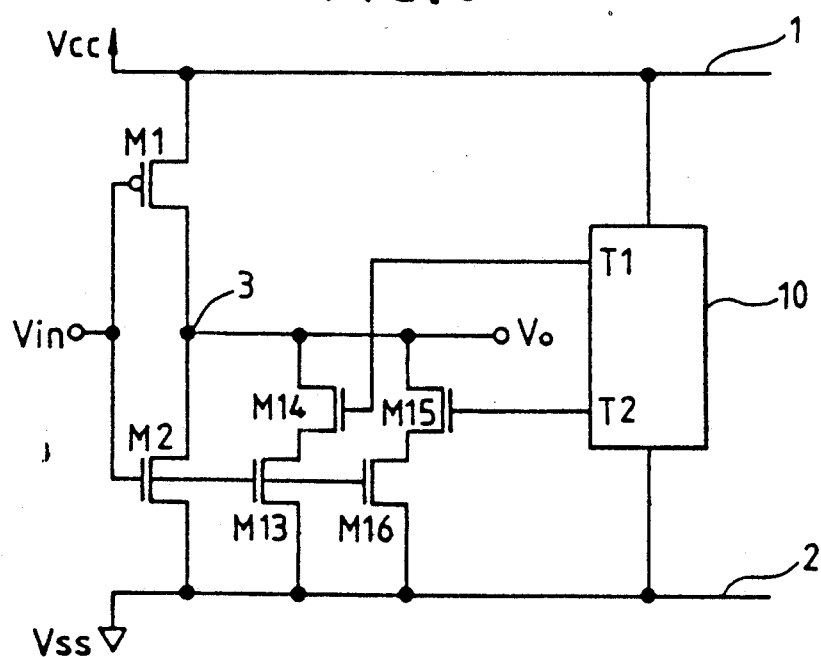
FIG. 6 illustrates another embodiment of the CMOS input buffer circuit in accordance with the present invention.

FIG. 6 illustrates another embodiment of the present invention. As in FIG. 3, M1 and M2 are serially connected between power line 1 supplying Vcc and power line 2 supplying Vss, and the TTL input Vin is connected to the gate of both M1 and M2. Two N channel MOS transistors M13 and M14 have their current electrodes serially connected between power line 2 and the point of connection between M1 and M2; M13 is connected to power line 2. Two more N channel MOS transistors M15 and M16 have their current electrodes serially connected between power line 2 and the point of connection between M1 and M2; M16 is connected to power line 2. TTL input Vin is also applied to the gate of M13 and M16; CMOS output is taken from the point of connection between M1 and M2.

As shown in FIG. 6, a temperature detecting circuit 10 has two inputs one of which is connected to power line 1 and the other to power line 2. The temperature detecting circuit 10 has an output terminal T1 connected to the gate of M14 and another output terminal T2 connected to the gate of M15.

In this embodiment, M14 and M15 are switches which are controlled by respective outputs from the temperature detecting circuit 10. Here, when the temperature decreases to below a predetermined level, the switching transistor(s) will be turned on. That causes the overall gain constant of N channel transistors M2, M13, and M16 to increase and the gain ratio $\beta\ r\ (\beta\ n\ /\beta\ p)$ to increase. Consequently, at low temperature, the logic threshold voltage level of the buffer is decreased. Effective temperature compensation is thus achieved.

Thus, between power line 2 and point of connection 3 is connected two pairs of a combination including an N channel MOS transistor M13/M16 and a switch M14/M15 (shown as an N channel MOS transistor). Each switch is connected between the point of connection 3 and the drain of the corresponding N channel transistor of which the source is connected to power line 2 and of which the gate is connected to TTL input Vin. Each switch is controlled by a separate signal from temperature detecting circuit 10. For the circuit of FIG. 6, the change in the gain constants ratio $\beta\ r$ vs temperature change is shown in Table 3:

TABLE 3

| Temperature (°K.) | 263~293 | 293~323 | 323~355 |
|---|---|---|---|
| M14 | ON | OFF | OFF |
| M15 | ON | ON | OFF |
| $\beta$ n | $\beta 2 + \beta 13 + \beta 16$ | $\beta 2 + \beta 16$ | $\beta 2$ |
| $\beta r = \frac{\beta n}{\beta p}$ | Large | Medium | Small |

The $\beta$ constants of M2, M14, and M16 of FIG. 6 are respectively designated as $\beta 2$, $\beta 14$, and $\beta 16$.

Therefore, the ratio $\beta$ r between the gain constants of the transistors will be $\beta\ 2/\beta$ p, as the temperature is increased above 323° K, and will be $(\beta\ 2 + \beta\ 14 + \beta\ 16)/\beta$ p, as the temperature is lowered to below 293° K. Hence the temperature characteristics of the logic threshold voltage in FIG. 5 can be obtained.

Figure 7:
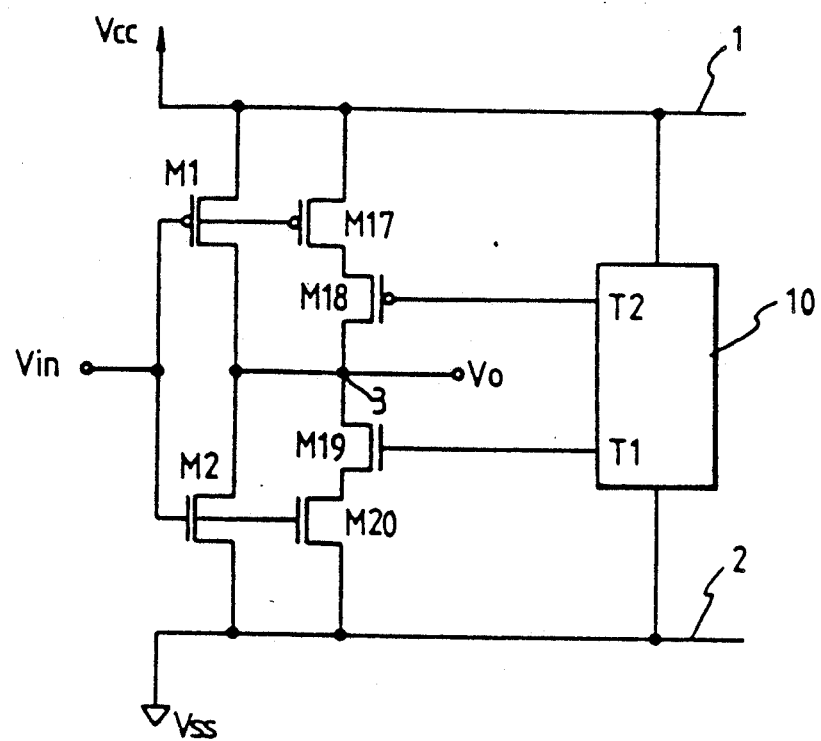
FIG. 7 illustrates further embodiment of the CMOS input buffer circuit in accordance with the present invention.

Another embodiment of the present invention is illustrated in FIG. 7. M1, a P channel MOS transistor, and M2, an N channel MOS transistor, are serially connected in between power line 1 supplying Vcc and power line 2 supplying Vss, in the same manner as in FIGS. 3 and 6; the source of M1 is connected to power line 1; the source of M2 is connected to power line 2; and the TTL input voltage $V_{in}$ is connected to the gate of both M1 and M2. The temperature detecting circuit 10 is the same as that shown in FIG. 4. Two P channel transistors M17 and M18 and two more N channel transistors M19 and M20 are serially connected (M17 to M18 to M19 to M20) through their current electrodes, between power line 1 (connected to M17) and power line 2 (connected to M20). The point of connection between M1 and M2 is connected to the point of connection between M18 and M19, and the CMOS output $V_o$ is taken from the point of connection between M18 and M19. The temperature detecting circuit 10 has one input connected to power line 1 and another input connected to power line 2. The T1 output terminal of the temperature detecting circuit 10 is connected to the gate of M19, and the T2 output terminal of the temperature detecting circuit 10 is connected to the gate of M18.

In this embodiment, a switch M18 is turned on when the temperature increases to above a predetermined level, and a switch M19 is turned on when the temperature decreases to below a predetermined level. When switch M18 is on, the overall gain constant of P channel MOS transistors M1 and M17 is increased, causing a decrease in the gain ratio $\beta$ r $(\beta$ n/$\beta$ p) which increases the logic threshold voltage level of the buffer. When switch 19 is on, the overall gain constant of N channel transistors M2 and M20 is increased, causing an increase in the gain ratio $\beta$ r $(\beta n/\beta$ p) which decreases the logic threshold voltage level. Effective temperature compensation is thus achieved.

For the circuit of FIG. 7, the change in the gain constant ratio $\beta$ r vs temperature change is shown in Table 4:

TABLE 4

| Temperature (°K.) | 263~293 | 293~323 | 323~355 |
|---|---|---|---|
| M18 | OFF | OFF | ON |
| M19 | ON | OFF | OFF |
| $\beta$ p | $\beta 1$ | $\beta 1$ | $\beta 1 + \beta 17$ |
| $\beta$ n | $\beta 2 + \beta 20$ | $\beta 2$ | $\beta 2$ |
| $\beta r = \frac{\beta n}{\beta p}$ | Large | Medium | Small |

The $\beta$ constants of M1, M2, M17, and M20 are respectfully designated as $\beta 1$, $\beta 2$, $\beta 17$, and $\beta 20$.

Therefore, the ratio $\beta$ r of the gain constants of the transistors will decrease to $$\frac{\beta 2}{\beta 1 + \beta 17}$$

as the temperature is increased to above 323° K, and will increase to $$\frac{\beta 2 + \beta 20}{\beta 1}$$

as the temperature is decreased to below 293° K. Hence, the temperature characteristics of the logic threshold voltage as shown in FIG. 5 can be obtained.

This invention varies the ratio of transistor gain constants (element size ratio) to stabilize the input level characteristics of a CMOS input buffer circuit relative to changes in temperature. In the low temperature region, the ratio of transistor gain constants is increased to suppress an increase in the logic threshold voltage level; in the high temperature region, the ratio of transistor gain constants is decreased to suppress a decrease of the logic threshold voltage level.

Though the foregoing description specifically discusses only two temperature-compensation points, different embodiments are readily made with just one, or more than two, such temperature-compensation points. The present invention is not limited to any particular number of such points. Each output from the temperature detecting circuit represents one such temperature-compensation point, as separately detected by a respective temperature sensor. In reference to the embodiment shown in FIG. 3, variations can be made in which either just one pair or more than two pairs of the combination of a P channel MOS transistor and a corresponding switch controlled by the temperature detecting circuit can be used. In reference to the embodiment shown in FIG. 6, variations can be made in which either just one pair or more than two pairs of the combination of an N channel MOS transistor and a corresponding switch controlled by the temperature detecting circuit can be used. In reference to the embodiment shown in FIG. 7, variations can be made in which more than one pair of a P channel MOS transistor and a corresponding switch controlled by the temperature detecting circuit can be connected between power line 1 and the point of connection between M1 and M2; other variations can be made in which more than one pair of an N channel transistor and a corresponding switch controlled by the temperature detecting circuit can be connected between power line 2 and the point of connection between M1 and M2.

Though FIG. 4 illustrates a specific temperature detecting circuit 10 of FIGS. 3, 6, and 7, alternative embodiments of the present invention may use any conventional temperature detecting circuit as circuit 10. Additionally, the polycrystalline resistors of FIG. 4 can be replaced in alternative embodiments by other temperature sensitive resistors of similar resistance to temperature characteristics as polycrystalline silicon.

What we claim is:

1. An input buffer circuit with compensation for device temperature change comprising:
   a first MOS transistor, of a first conduction type; a second MOS transistor, of a second conduction type; said first and second MOS transistors are serially connected by their current electrodes between a first power source and a second power source;
   an buffer input signal is applied to the gate of both said first and second MOS transistor, and a CMOS output signal is provided from a point of serial connection between said first and second MOS transistors;
   a third MOS transistor, of said first conduction type; said buffer input also being connected to the gate of said third MOS transistor;
   a switch switched by a signal indicating whether the device temperature is above or below a predetermined level;
   said third MOS transistor has a current electrode connected to said first power source, and another current electrode connected by said switch to the point of connection between said first MOS transistor and said second MOS transistor;
   whereby the logic threshold voltage level of the buffer is adjusted to provide temperature compensation.

2. A buffer circuit as recited in claim 1, wherein:
   said first conduction type is P channel;
   said second conduction type is N channel; and
   said switch is turned on when the device temperature increases to above said predetermined temperature level.

3. A buffer circuit as recited in claim 1, wherein:
   said first conduction type is N channel;
   said second conduction type is P channel; and
   said switch is turned on when the device temperature decreases to below said predetermined temperature level.

4. A buffer circuit as recited in claim 2, wherein:
   said first power source supplies Vcc;
   said second power source supplies Vss; and
   said first MOS transistor in said serial connection connects to said first power source and said second MOS transistor in said serial connection connects to said second power source.

5. A buffer circuit as recited in claim 3, wherein:
   said first power source supplies Vss;
   said second power source supplies Vcc; and
   said first MOS transistor in said serial connection connects to said first power source and said second MOS transistor in said serial connection connects to said second power source.

6. A buffer circuit as recited in claim 4, wherein:
   said switch is a P channel MOS transistor.

7. A buffer circuit as recited in claim 5, wherein: said switch is an N channel MOS transistor.

8. A buffer circuit as recited in claim 1, wherein:
   said signal switching said switch is generated by a circuit including a means for supplying current and a temperature sensitive resistor connected in series with said current supply means.

9. A buffer circuit as recited in claim 8, wherein:
   said circuit generating said switching signal further includes a means for converting an electrical signal at the point of connection between said current supply means and said temperature sensitive resistor to a digital signal constituting said switching signal for a corresponding switch.

10. A buffer circuit as recited in claim 9, wherein:
    said temperature sensitive resistor is made of polycrystalline silicon.

11. A buffer circuit as recited in claim 10, wherein:
    said converting means comprises two inverters connected in cascade.

12. A buffer circuit as recited in claim 10, wherein:
    said current supply means is a transistor set to operate in the subthreshold region.

13. A buffer circuit as recited in claim 12, wherein:
    said circuit generating said switching signal further includes a current setting means for setting the current supplied by said transistor constituting said current supply means.

14. A buffer circuit as recited in claim 13, wherein said current setting means provides an output to the gate electrode of said transistor constituting said current supply means and comprises:
    a first MOS transistor of one conduction type, which has a current electrode connected to a power source, a control electrode connected to another power source, and another current electrode connected to a first node;
    a second MOS transistor of another conduction type, which has a current electrode and a control electrode connected to said first node, and another current electrode connected to said another power source; said second MOS transistor has a sufficiently large geometric size relative to that of said first MOS transistor to have said second MOS transistor being operated in the subthreshold region;
    a third MOS transistor of said another conduction type, which has a control electrode connected to the control electrode of said second MOS transistor, a current electrode connected to said another power source, and another current electrode connected to a second node; said third MOS transistor has a geometric size smaller than that of said second MOS transistor;

a fourth MOS transistor of said one conduction type, which has a first current electrode connected to said one power source, and a control electrode and another current electrode both connected to said second node; said fourth MOS transistor has a sufficiently large geometric size relative to that of said third MOS transistor to have said fourth MOS transistor being operated in the subthreshold region; and said output of the current setting means is provided from said second node.

15. An input buffer circuit with compensation for device temperature change comprising:
a first MOS transistor, of a first conduction type; a second MOS transistor, of a second conduction type; said first and second MOS transistors are serially connected by their current electrodes between a first power source and a second power source;
a buffer input signal is applied to the gate of both said first and second MOS transistor, and a CMOS output signal is provided from a point of serial connection between said first and second MOS transistors;
a plurality of third MOS transistors, all being of said first conduction type; said buffer input also being connected to the gate of all said third MOS transistor;
a plurality of switches, each being switched by a respective signal indicating whether the device temperature is above or below a different predetermined level;
each said third MOS transistor has a current electrode connected to said first power source, and another current electrode connected by a corresponding one of said switches to the point of connection between said first MOS transistor and said second MOS transistor;
whereby the logic threshold voltage level of the buffer is adjusted to provide temperature compensation.

16. A buffer circuit as recited in claim 15, wherein:
said first conduction type is P channel;
said second conduction type is N channel; and
each of said switch is turned on when the device temperature increases to above a predetermined level as indicated by the associated switching signal of each said switch.

17. A buffer circuit as recited in claim 15 wherein:
said first conduction type is N channel;
said second conduction type is P channel; and
each of said switch is turned on when the device temperature decreases to below a predetermined level as detected by the associated switching signal of each said switch.

18. A buffer circuit as recited in claim 16, wherein:
said first power source supplies Vcc;
said second power source supplies Vss; and
said first MOS transistor in said serial connection connects to said first power source and said second MOS transistor in said serial connection connects to said second power source.

19. A buffer circuit as recited in claim 17, wherein:
said first power source supplies Vss;
said second power source supplies Vcc; and
said first MOS transistor in said serial connection connects to said first power source and said second MOS transistor in said serial connection connects to said second power source.

20. A buffer circuit as recited in claim 18, wherein:
each said switch is a P channel MOS transistor.

21. A buffer circuit as recited in claim 19, wherein:
each said switch is an N channel MOS transistor.

22. A buffer circuit as recited in claim 15, wherein:
each said switching signal switching an associated switch is generated by a respective circuit including a means for supplying current and a temperature sensitive resistor connected in series with said current supply means.

23. A buffer circuit as recited in claim 22, wherein:
each of said circuit generating one of said switching signals and including a current supply means and a temperature sensitive resistor, further includes a means for converting an electrical signal at the point of connection between said current supply means and said temperature sensitive resistor to a digital signal constituting said switching signal for a corresponding switch.

24. A buffer circuit as recited in claim 23, wherein:
each said current supply means supplies a different amount of current, whereby different switching signals correspond to different temperature levels.

25. A buffer circuit as recited in claim 23, wherein:
each said temperature sensitive resistor has a resistance different from that of each other at the same temperature, whereby different switching signals correspond to different temperature levels.

26. A buffer circuit as recited in claim 24, wherein:
said temperature sensitive resistor is made of polycrystalline silicon.

27. A buffer circuit as recited in claim 25, wherein:
said temperature sensitive resistor is made of polycrystalline silicon.

28. A buffer circuit as recited in claim 26, wherein each said current supply means is a transistor set to operate in the subthreshold region, and has a different geometric size from each other.

29. A buffer circuit as recited in claim 27, wherein each said current supply means is a transistor set to operate in the subthreshold region.

30. A buffer circuit as recited in claim 28, wherein:
each said transistor constituting a current supply means is set by a signal applied to its control electrode from a means for setting the current supplied by said current supply means.

31. A buffer circuit as recited in claim 29, wherein:
each said transistor constituting a current supply means is set by a signal applied to its control electrode from a current setting means for setting the current supplied by said current supply means.

32. An input buffer circuit with compensation for device temperature change comprising:
a first MOS transistor, of a first conduction type; a second MOS transistor, of a second conduction type; said first and second MOS transistors are serially connected by their current electrodes between a first power source and a second power source;
a buffer input signal is applied to the gate of both said first and second MOS transistor, and a CMOS output signal is provided from a point of serial connection between said first and second MOS transistors;

a third MOS transistor, of said first conduction type; said buffer input also being connected to the gate of said third MOS transistor;

a first switch switched by a signal indicating whether the device temperature is above or below a first predetermined level;

said third MOS transistor has a current electrode connected to said first power source, and another current electrode connected by said first switch to the point of connection between said first MOS transistor and said second MOS transistor;

a fourth MOS transistor, of said second conduction type; said buffer input signal also being connected to the gate of said fourth MOS transistor;

a second switch switched by a signal indicating whether the device temperature is above or below a second predetermined level;

said fourth MOS transistor has a current electrode connected to said second power source, and another current electrode connected by said second switch to the point of connection between said first MOS transistor and said second MOS transistor;

whereby the logic threshold voltage level of the buffer is adjusted to provide temperature compensation.

33. A buffer circuit as recited in claim 32, wherein: said first conduction type is P channel; said second conduction type is N channel; said first switch is turned on when the device temperature increases to above said first predetermined temperature level; and said second switch is turned on when the device temperature decreases to below said second predetermined temperature level.

34. A buffer circuit as recited in claim 33, wherein: said first power source supplies Vcc; said second power source supplies Vss; and said first MOS transistor in said serial connection connects to said first power source and said second MOS transistor in said serial connection connects to said second power source.

35. A buffer circuit as recited in claim 34, wherein: said first switch is a P channel MOS transistor.

36. A buffer circuit as recited in claim 35, wherein: said second switch is an N channel MOS transistor.

37. A buffer circuit as recited in claim 32, wherein: each said switching signal is generated by a circuit including a means for supplying current and a temperature sensitive resistor connected in series with said current supply means.

38. A buffer circuit as recited in claim 37, wherein: each of said circuit generating one of said switching signals and including a current supply means and a temperature sensitive resistor, further includes a means for converting an electrical signal at the point of connection between said current supply means and said temperature sensitive resistor to a digital signal constituting said switching signal for a corresponding switch.

39. A buffer circuit as recited in claim 38, wherein: said temperature sensitive resistor is made of polycrystalline silicon.

40. A buffer circuit as recited in claim 39, wherein each said current supply means is a transistor set to operate in the subthreshold region.

41. A buffer circuit as recited in claim 40, wherein: each said transistor constituting a current supply means is set by a signal applied to its control electrode from a current setting means for setting the current supplied by said current supply means.

42. A buffer circuit as recited in claim 41, wherein: each said transistor constituting a current supply means has a geometric size different from that of each other, whereby different switching signals correspond to different temperature levels.

43. A buffer circuit as recited in claim 41, wherein: each said temperature sensitive resistor has a resistance different from that of each other at the same temperature, whereby different switching signals correspond to different temperature levels.

* * * * *